United States Patent [19]

Sims

[11] Patent Number: 5,206,913

[45] Date of Patent: Apr. 27, 1993

[54] METHOD AND APPARATUS FOR LOGIC CONTROLLED MICROPHONE EQUALIZATION

[75] Inventor: Travis M. Sims, Rio Rancho, N. Mex.

[73] Assignee: Lectrosonics, Inc., Rio Rancho, N. Mex.

[21] Appl. No.: 657,177

[22] Filed: Feb. 15, 1991

[51] Int. Cl.$^5$ .............................................. H03G 5/00
[52] U.S. Cl. ...................................... 381/103; 381/92; 381/119
[58] Field of Search ............... 381/83, 93, 119, 92, 381/103, 104, 98

[56] References Cited

U.S. PATENT DOCUMENTS

| | | | |
|---|---|---|---|
| 3,728,476 | 4/1973 | Bates et al. ............................. | 358/31 |
| 4,064,462 | 12/1977 | Goehler et al. ......................... | 330/2 |
| 4,079,199 | 3/1978 | Patronis, Jr. . | |
| 4,088,835 | 5/1978 | Thurmond et al. . | |
| 4,091,236 | 5/1978 | Chen . | |
| 4,165,445 | 8/1979 | Brosow . | |
| 4,425,481 | 1/1984 | Mansgold et al. ................... | 381/68.2 |
| 4,602,337 | 7/1986 | Cox ...................................... | 381/83 |
| 4,620,217 | 10/1986 | Songer .................................. | 358/23 |
| 4,683,590 | 7/1987 | Miyoshi et al. ...................... | 381/83 |
| 4,885,792 | 12/1989 | Christensen et al. ............... | 381/119 |
| 4,947,432 | 8/1990 | Topholm ............................. | 381/68.2 |
| 5,083,312 | 1/1992 | Newton et al. ..................... | 381/68.2 |

FOREIGN PATENT DOCUMENTS

| | | |
|---|---|---|
| 59-194597 | 11/1984 | Japan . |
| 62-11400A | 1/1987 | Japan . |
| 62-278898 | 12/1987 | Japan . |
| 63-18796A | 1/1988 | Japan . |
| 63-84299A | 4/1988 | Japan . |

Primary Examiner—Forester W. Isen
Attorney, Agent, or Firm—Deborah A. Peacock; Donovan F. Duggan

[57] ABSTRACT

A sound system microphone equalization apparatus and method comprising a plurality of filters programmable by a microprocessor. User interfaces permit adjustment for each microphone channel of the parameters of the three notch filters, and four tone control filters in the filter network.

29 Claims, 8 Drawing Sheets

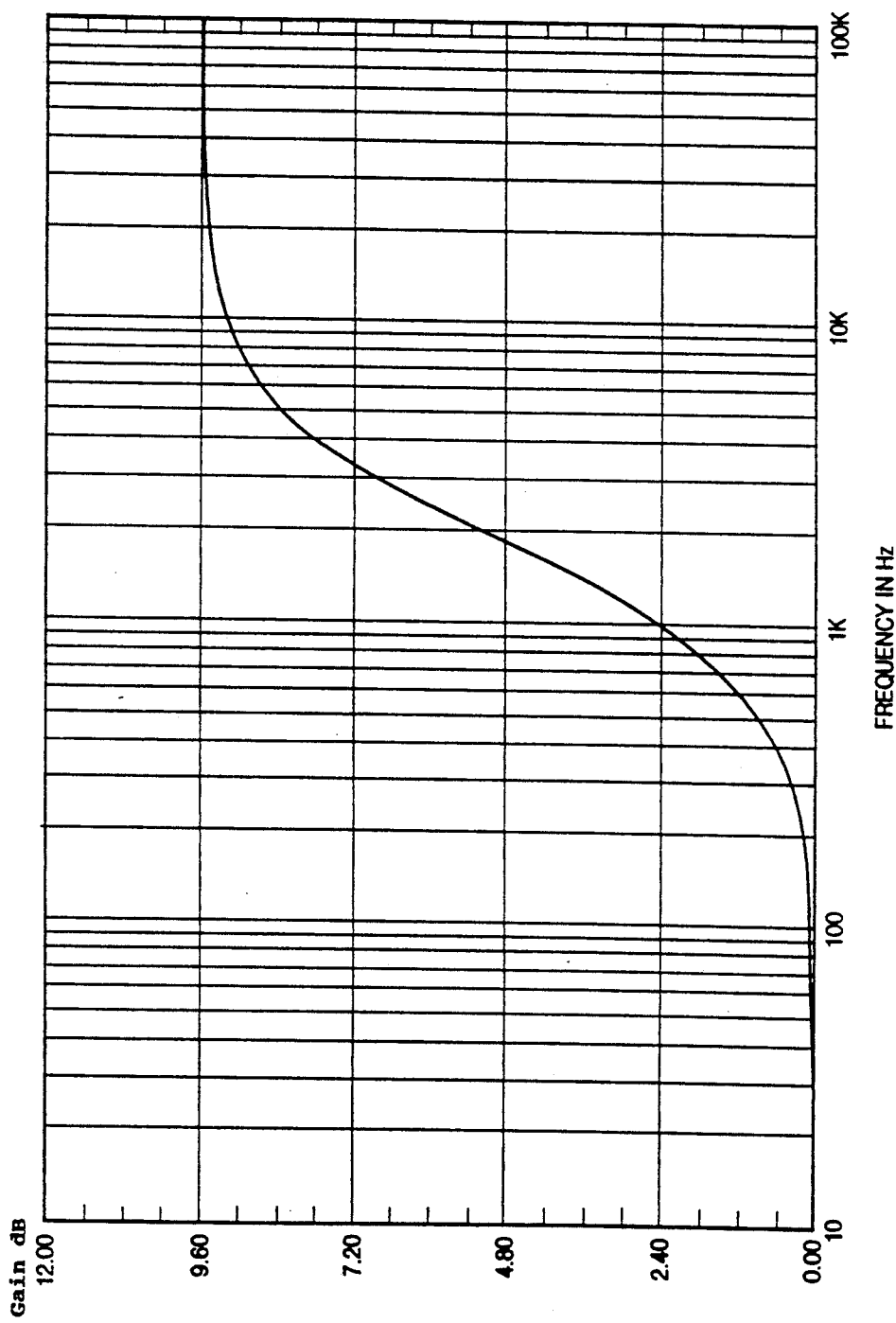
FIG—8

METHOD AND APPARATUS FOR LOGIC CONTROLLED MICROPHONE EQUALIZATION

CROSS-REFERENCE TO RELATED APPLICATIONS

A related application entitled Sound Systems with Rate Controlled, Variable Attenuation, to Sims, was filed Sep. 26, 1990, as application Ser. No. 07/588,446, the teachings of which are incorporated by reference herein.

BACKGROUND OF THE INVENTION

1. Field of the Invention (Technical Field):

The invention relates to apparatus for audio frequency equalization of multiple microphone sound systems, and a method for its use.

2. Background Art:

A sound system comprising multiple speakers and multiple microphones typically finds use in churches, conference rooms, meeting rooms, council chambers, and the like. Normally such spaces provide a poor acoustic match for the system loudspeakers employed therein. Accordingly, electronic equalization of loudspeaker response to provide more uniform system frequency response has long been utilized in sound system installation.

The problem of audio frequency equalization, however, exists with regard to microphones as well as loudspeakers. Broadly, audio frequency equalization and gain control of microphones has been accomplished by using manned audio mixing consoles or automatic microphone mixers. Manned consoles may employ a full-time operator to adjust both level and equalization of microphone channels to increase sound quality and eliminate feedback. These full-time manned systems are normally found in large audience capacity situations, for example, "live" concerts, and the like.

Sound systems without a full-time operator are normally found in smaller audience capacity situations, for example, the aforementioned council chambers, conference rooms, churches, and the like. Frequently, these sound systems employ part-time operators or automatic mixers that continuously adjust the level of each microphone channel, turning on only those channels in use. Further, most automatic mixers provide a logic output signal indicating the status (on or off) of each channel.

However, these mixers for smaller sound systems, whether manned part-time or automatic, cannot be fully optimized because microphone equalization is not available. Equalizers and filters may be patched into each microphone channel, but this solution is complex and relatively expensive.

U.S. Pat. No. 4,088,835 to Thurmond, et al., entitled Comprehensive Feedback Elimination System Employing Notch Filter, discloses a manual system capable only of producing a single equalization curve. Similarly, with U.S. Pat. No. 4,064,462, to Goehler, et al., entitled Acoustic Feedback Peak Elimination Unit; U.S. Pat. No. 4,091,236, to Chen, entitled Automatically Tunable Notch Filter and Method for Suppression of Acoustical Feedback; U.S. Pat. No. 4,079,199, to Patronis, Jr., entitled Acoustic Feedback Detector and Automatic Gain Control; and U.S. Pat. No. 4,165,445, to Brosow, entitles Circuit for Preventing Acoustic Feedback, all disclose circuitry wherein unwanted feedback detection and suppression operate by detecting the presence of a sustained frequency and subsequently either reducing system gain or tuning a notch filter to the unwanted frequency. U.S. Pat. No. 4,683,590, to Miyoshi, et al., entitled Inverse Control System, discloses an adaptive digital signal processing technique to modify frequency response to provide better performance; the system, however, is limited to a single equalization curve.

SUMMARY OF THE INVENTION

Disclosure of the Invention

The present invention relates to an apparatus and method for equalizing a single microphone channel. The invention comprises means simultaneously providing an audio signal to a filter network and a logic signal to a microprocessor and selectively filtering the audio signal based upon the logic signal provided to the microprocessor. An automatic audio mixer is used to simultaneously provide an audio signal to the filter network and a logic signal to the microprocessor.

The filter network preferably comprises a plurality of notch filters each having a bandpass filter and a common subtraction circuit. The notch filters preferably have variable attenuation frequencies in the range of between approximately 50 Hz and 5 Khz. The filter network preferably further comprises a plurality of tone control filters, each of which may be either a high pass filter, a low pass filter, or a bandpass filter.

The microprocessor preferably further comprises a non-volatile memory, and user controls, such as filter parameter adjustments, and a user display.

The sound system preferably further comprises a link thereby utilizing a plurality greater than eight microphone channels, an output amplifier, a power amplifier, and a loudspeaker. The audio signal may be selectively filtered by selecting the operational mode of the microprocessor; selecting the appropriate filter function parameters; and adjusting the selected filter function parameters. The selected filter function parameters may be adjusted by programming a plurality of filters in the filter network, such as by programming a plurality of notch filters and/or programming a plurality of tone control filters in the filter network.

The preferred apparatus and method of the invention for equalizing multiple microphones in a sound system comprises connecting a plurality of microphones to an automatic audio mixer, providing audio signals from the automatic audio mixer, providing logic signals from the automatic audio mixer, amplifying and coupling the audio signals to a filter network, coupling the logic signals to a microprocessor, selectively filtering the audio signals and amplifying and coupling the filtered audio signals to a loudspeaker. A logic signal is preferably provided for each active microphone, using a logic input. The filter network preferably comprises three notch filters and four tone control filters which are all programmable.

The primary object of the present invention is to provide equalization on an individual channel basis for multichannel audio systems.

Another object of the invention is to provide tone controls for shaping the frequency response of an audio input (microphone) channel.

Yet another object of the invention is to provide notch filtering for eliminating feedback and ringing modes associated with each input (microphone) channel.

Still another object of the invention is to provide equalization responsive to externally provided logic signals.

An advantage of the invention is the provision of individual channel equalization without operator intervention.

Another advantage of the invention is the provision of tone control filters which reduce or eliminate tonal difference between channels.

Yet another advantage of the invention is the provision of notch filters which allow higher gain and more margin against feedback.

Still another advantage of the invention is the provision of timeshared filters which are cost effective.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention.

FIG. 8 depicts the high pass frequency response characteristics of the treble filter.

DESCRIPTION OF THE PREFERRED EMBODIMENTS

Best Mode for Carrying Out the Invention

Figure 1:
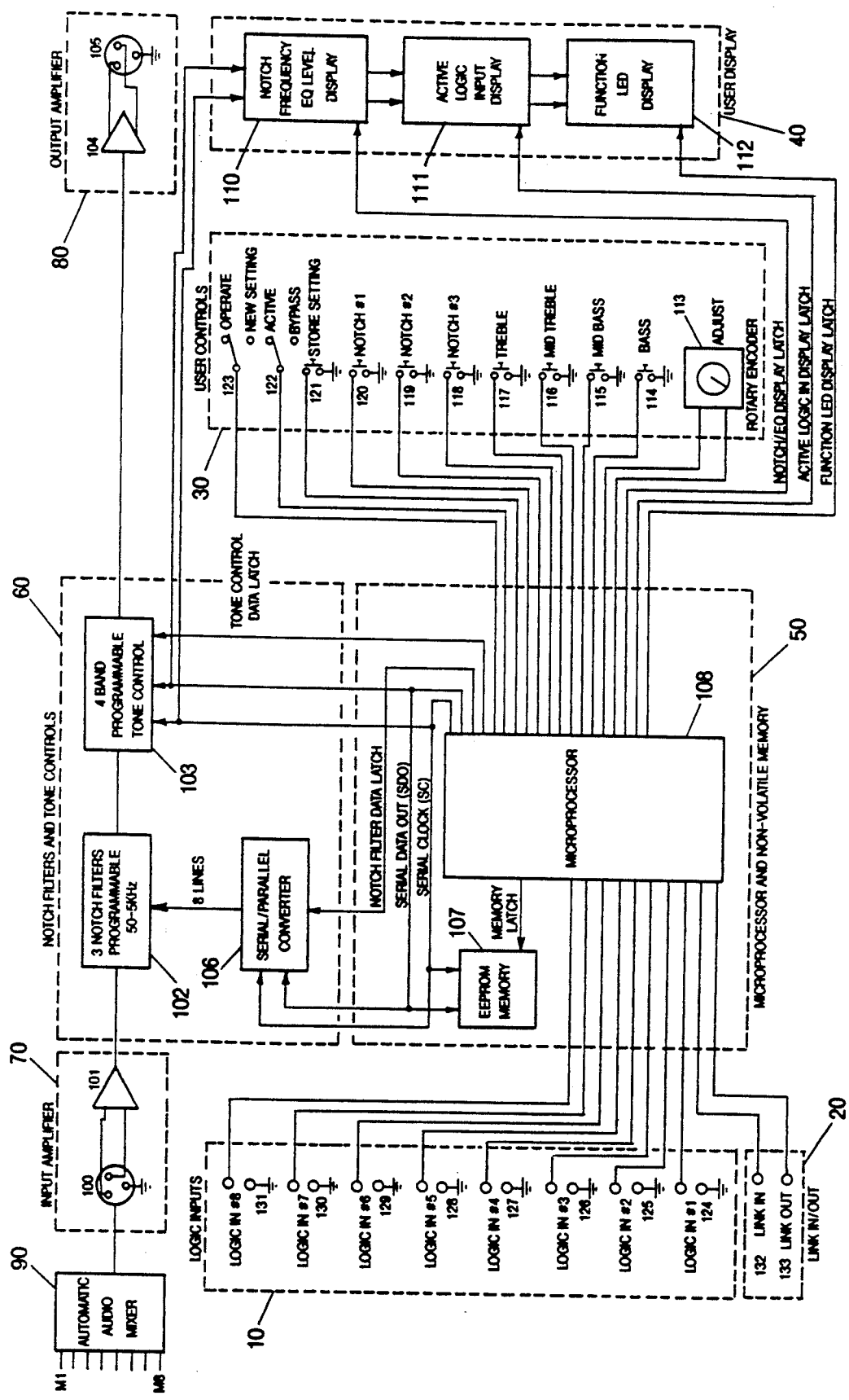
FIG. 1 is a detailed block diagram of the invention.
Figure 2:
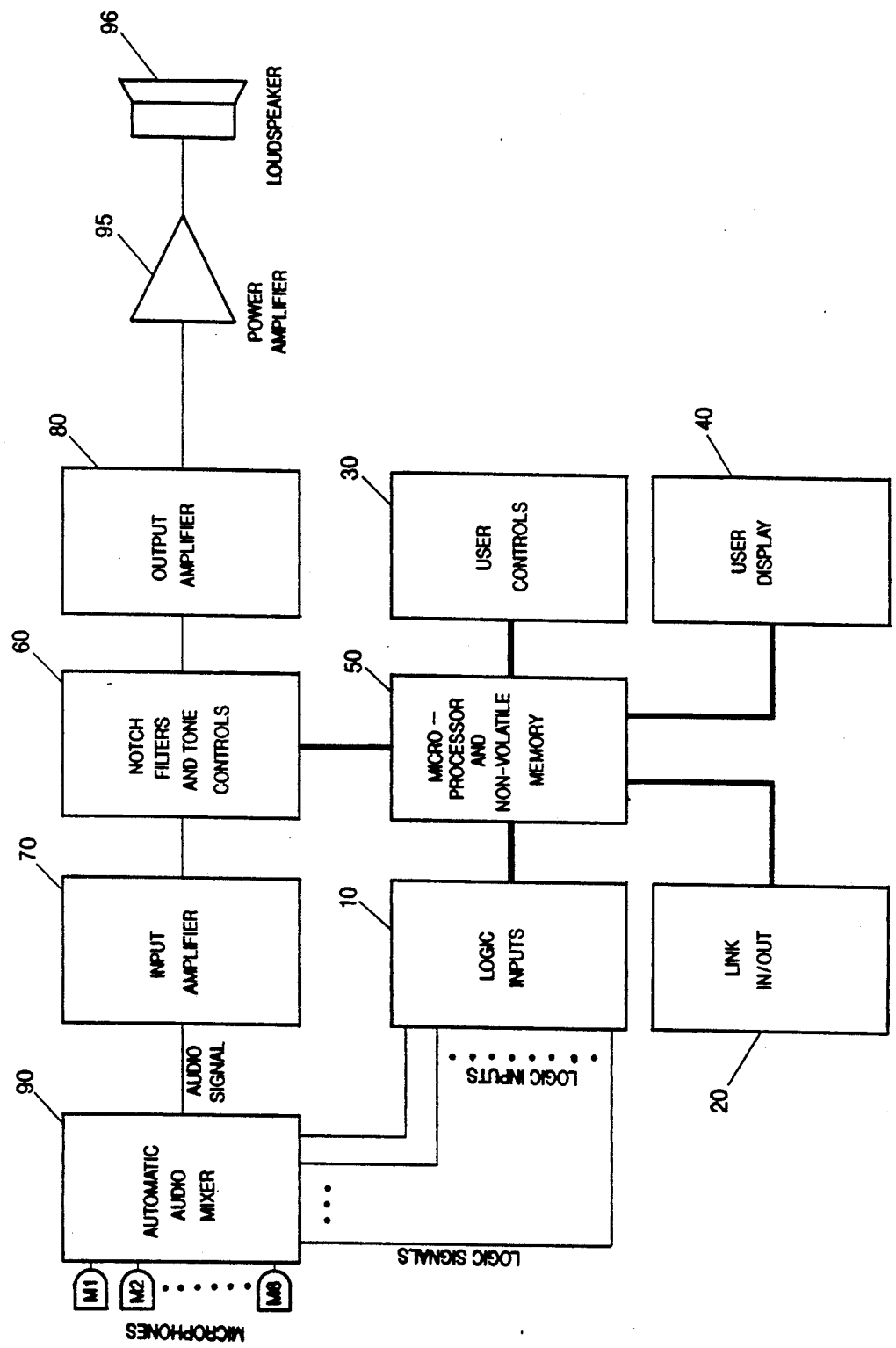
FIG. 2 is a simplified block diagram of the invention in a multichannel sound system.
Figure 3:
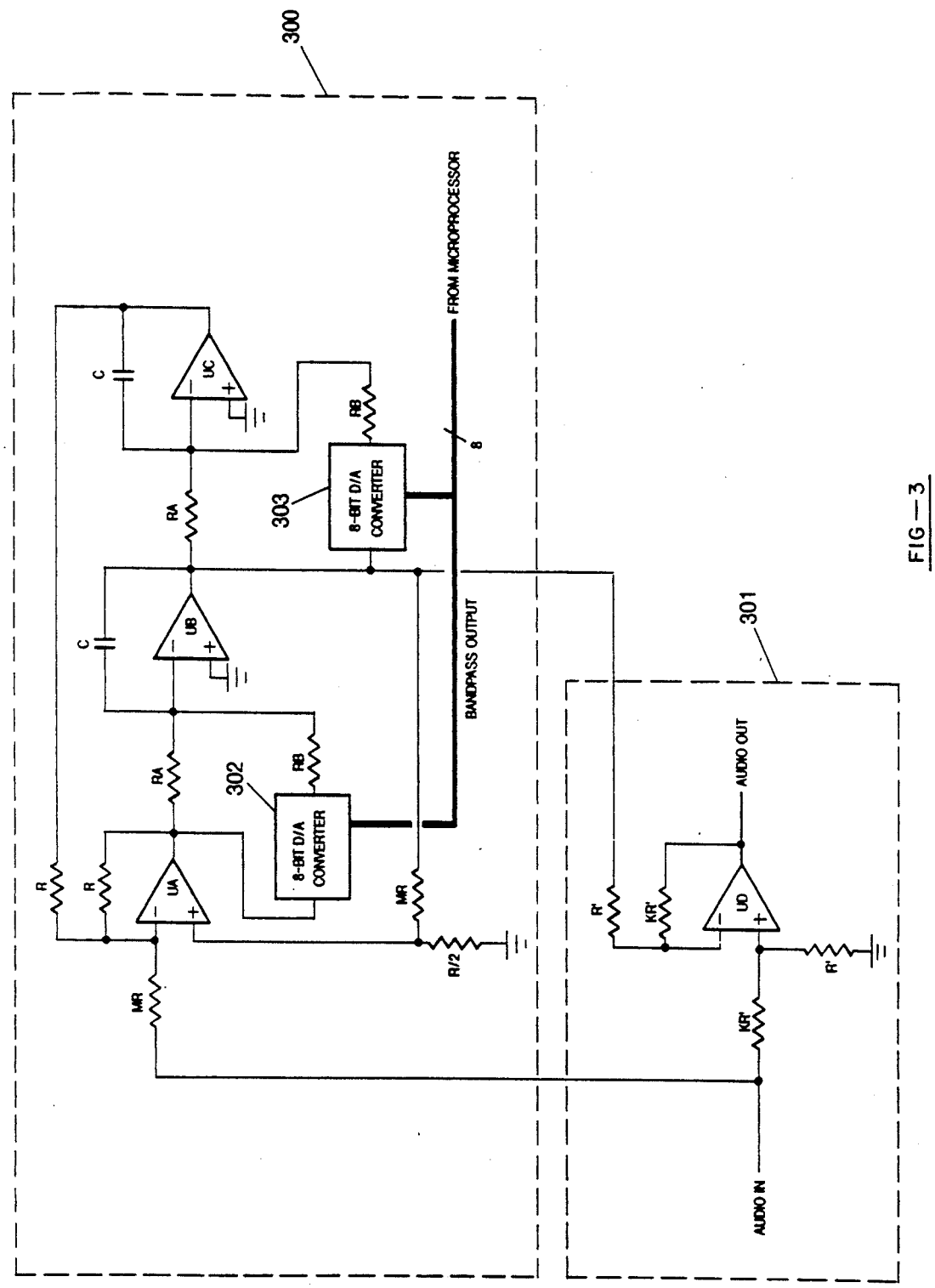
FIG. 3 is a schematic diagram of the notch filter of the invention.

Reference is now made to FIGS. 1-3, which illustrate the preferred embodiment of the invention. One or more signals from microphones M1-M8, for example, are input to automatic audio mixer 90. Automatic audio mixer 90 simultaneously outputs audio frequency signals and logic signals. The logic signals may comprise signals resulting from transistor-transistor logic (TTL), digital inputs, relay contact closures, electronic switch closures, and the like.

Logic signals are applied to appropriate logic inputs 124-131 in logic input connector 10. Logic input connector 10, in turn, inputs logic input signals indicating specific microphone activity to microprocessor and non-volatile memory 50. Microprocessor and non-volatile memory 50 may, in turn, comprise microprocessor 108 and EEPROM 107, for example.

The audio frequency signal or signals from automatic mixer 90 are first routed to input amplifier 70, comprising input connector 100 and differential amplifier 101, then to programmable notch filters 102.

Microprocessor 50 receives the various logic input signals and programs the tone control and notch filters to the appropriate parameters for the associated microphone channel. Link connector 20 can provide additional multiples of the basic eight channel system, if required, thereby accommodating more than eight microphone channels.

Microprocessor 50 provides user interface by user control 30 and user display 40. User control 30 comprises switch 123 which has two settings: operate and new setting. In the "operate" mode, no user controls, with the exception of active/bypass switch 122, are recognized by microprocessor 108. Activity from logic input 10 and link connector 20 will, however, be recognized.

In the "new setting" mode, all user controls are recognized by microprocessor 108. Push buttons 114-120 select the particular filter to be adjusted; and the parameters of such filter, including notch frequency/equalization level display, active logic input display, and function LED display, are displayed on display elements 110-112, respectively of user display 40. Filter parameters may then be adjusted using rotary encoder 113. If a tone control filter has been selected, rotary "ADJUST" 113 enables selection of the number of decibels added or reduced. If a notch filter is selected, rotary "ADJUST" 113 enables selection of the center frequency of the frequency band to be attenuated Notch filters 102 comprise three digitally controlled statevariable band-elimination filters. These high-Q filters eliminate feedback frequencies specific to each microphone channel. The center frequencies, or frequencies of maximum attenuation, are variable from 50 Hz to 5 KHz.

FIG. 3 depicts a preferred embodiment of the notch filters of the invention. The illustrated notch filter generally comprises two components: narrow bandpass filter 300 and substraction circuit 301. Narrow bandpass filter 300 comprises cascaded operational amplifiers UA, UB, and UC. Operational amplifier UA performs a summing function of the audio input signal and the analog signal from digital-to-analog converter 302. Digital-to-analog converter 302 receives 8-bit parallel notch filter input data from microprocessor 108 through serial/parallel converter 106. The summed output of operational amplifier UA is routed to integrating operational amplifiers UB and UC. The resulting pass band is a compromise between a frequency band narrow enough to be inaudible but broad enough such that changes in the ambient temperature of the acoustic space will not move the feedback modes of the space outside the effective band width of the notch filter.

The bandpass output from bandpass filter circuit 300 is input to substraction circuit 301. After subtraction of the bandpass signal from the audio signal by operational amplifier UD, the notch filtered audio signal is input to four-band programmable tone control 103. (See FIG. 1).

The center frequency of bandpass filter 300 is determined by the following equation:

$$F_o = \cfrac{1}{2*Pi*C* \left[ \cfrac{(RA)*\left(N*\cfrac{RB}{256}\right)}{(RA) + \left(N*\cfrac{RB}{256}\right)} \right]}$$

where N is between 0 and 255 and represents the code input to the 8-bit digital-to-analog converters 302,303 from microprocessor 108. For a given value of C, RA and RB determine the minimum (Fmin) and maximum (Fmax) frequencies to which the filter can be tuned. It should be noted that C may be a variable capacitor to provide different frequency ranges.

The resolution of the notch filters (that is, the minimum change in center frequency, $F_o$) is:

$$\text{Resolution} = \frac{F\text{max} - F\text{min}}{256}$$

Q (frequency selectivity) of the filter is:

$$Q = \frac{2*M + 1}{3}$$

where M is the multiplier for R in the bandpass filter circuit 300.

The maximum gain of bandpass filter circuit 300 at $F_o$ is one (0 dB).

The maximum attenuation in decibels (dB) of the subtraction circuit 301 is:

$$\text{Attenuation-20 log}_{10}(1-K),$$

where K is the multiplier of R' in subtraction circuit 301.

The advantages of this band-elimination state-variable filter over voltage-controlled voltage source filters and passive-element filters are its improved parametric stability and ease of adjustment. Further, center frequency can be tuned while maintaining constant Q. Additionally, of course, such filters readily lend themselves to integrated circuit fabrication, thereby minimizing addition of passive circuit components, such as resistors and capacitors. Provision of subtraction circuit 301 in combination with bandpass filter 300 provides a band-elimination filter which permits a relatively low Q bandpass filter 300.

The processed audio signal is then routed to programmable tone control filters 103. Tone control filters 103 generally comprise a treble (high pass) filter, a bass low filter, and bandpass filters for the mid-pass and mid-treble frequencies. Tone control filters 103 also receive programmed input from microprocessor 108 on buses comprising the tone control data latch, serial data input, and serial clock input. Tone control filters 103 are conventional active filters, such as, for example, National Semiconductor LMC 835 (TRADEMARK) integrated circuits, and the like.

Figure 4:
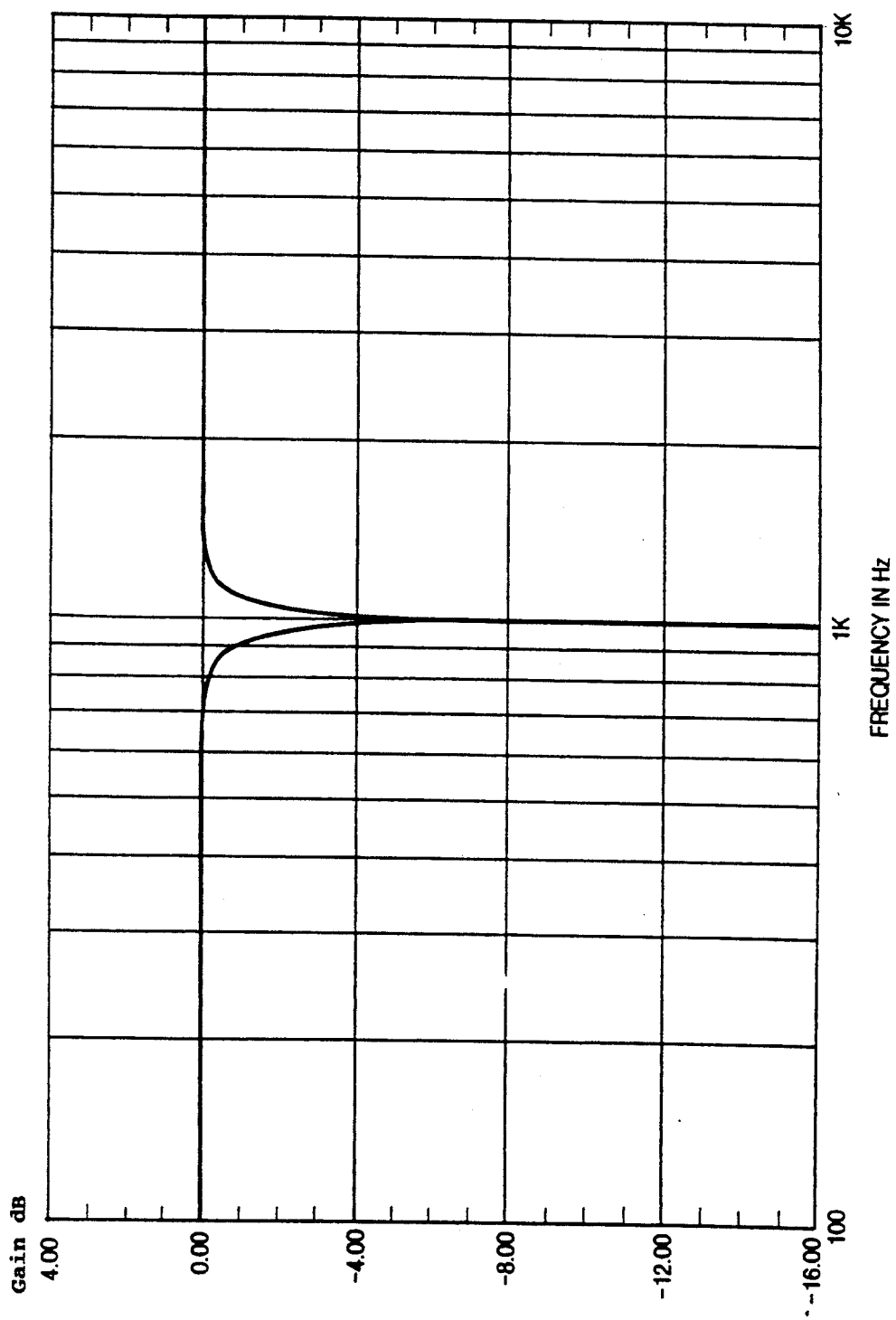
FIG. 4 is a typical frequency response graph of the notch filter of the invention.
Figure 5:
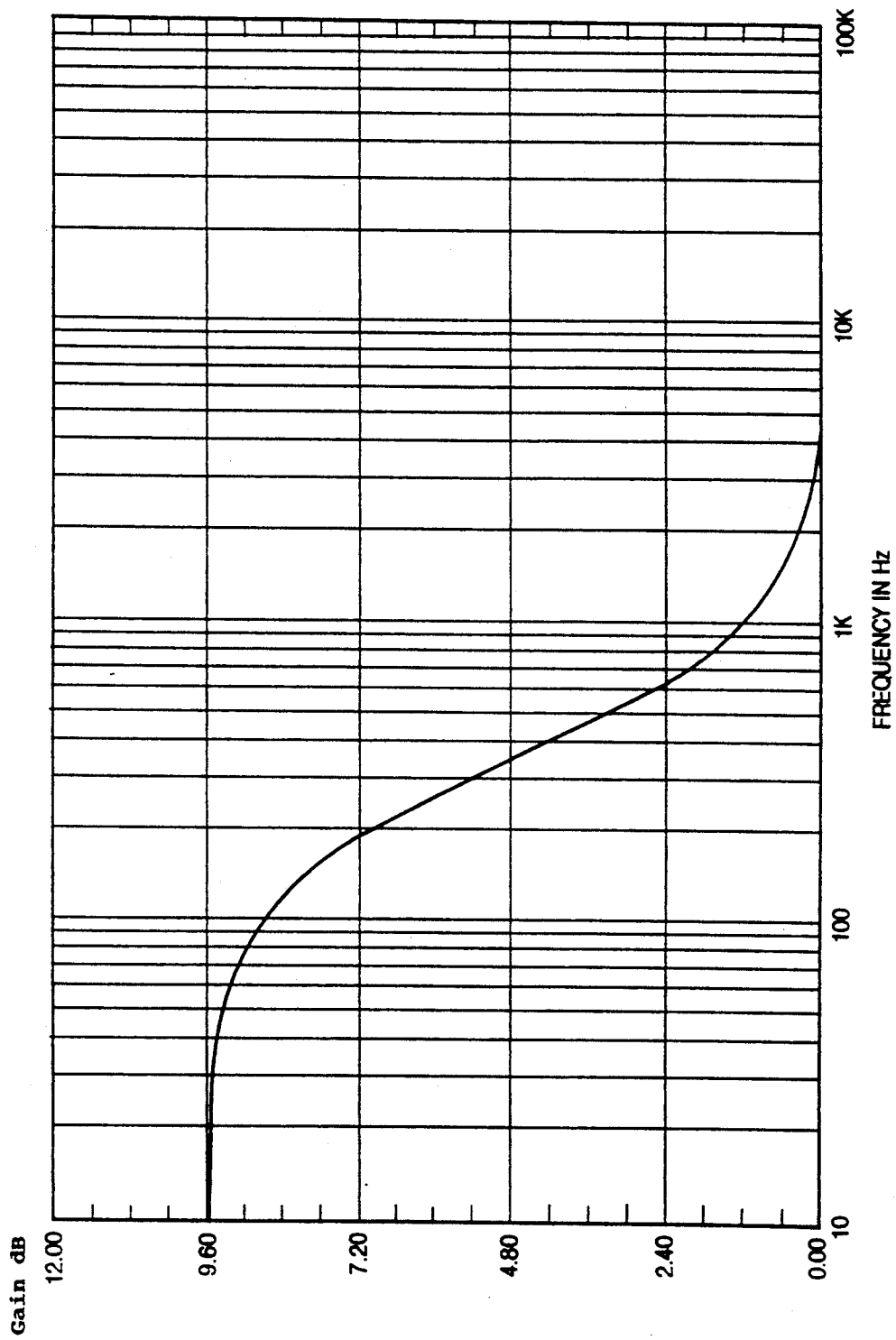
FIG. 5 is a frequency response graph of the bass tone control filters.
Figure 6:
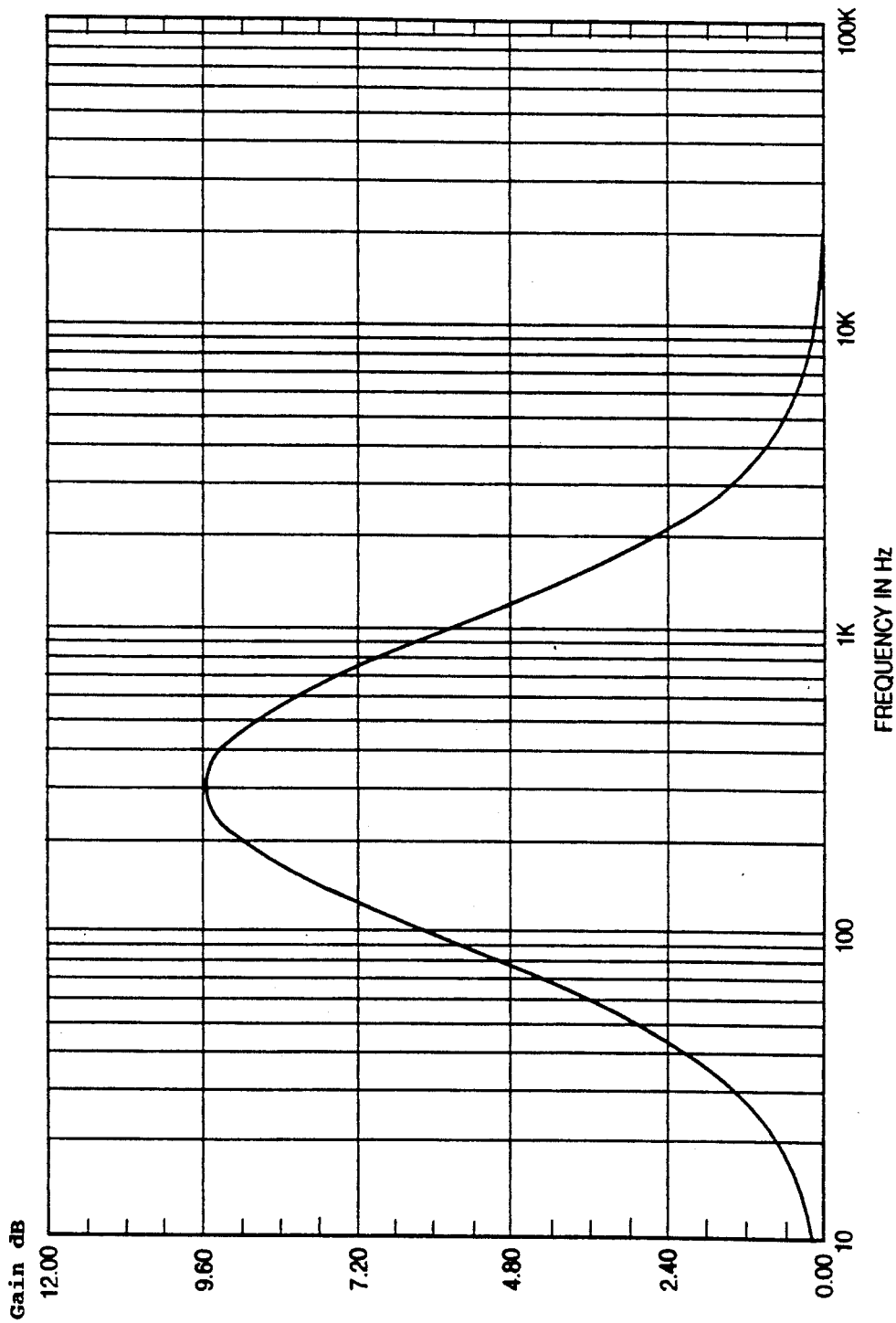
FIG. 6 illustrates the bandpass frequency characteristics of the mid-bass filter.
Figure 7:
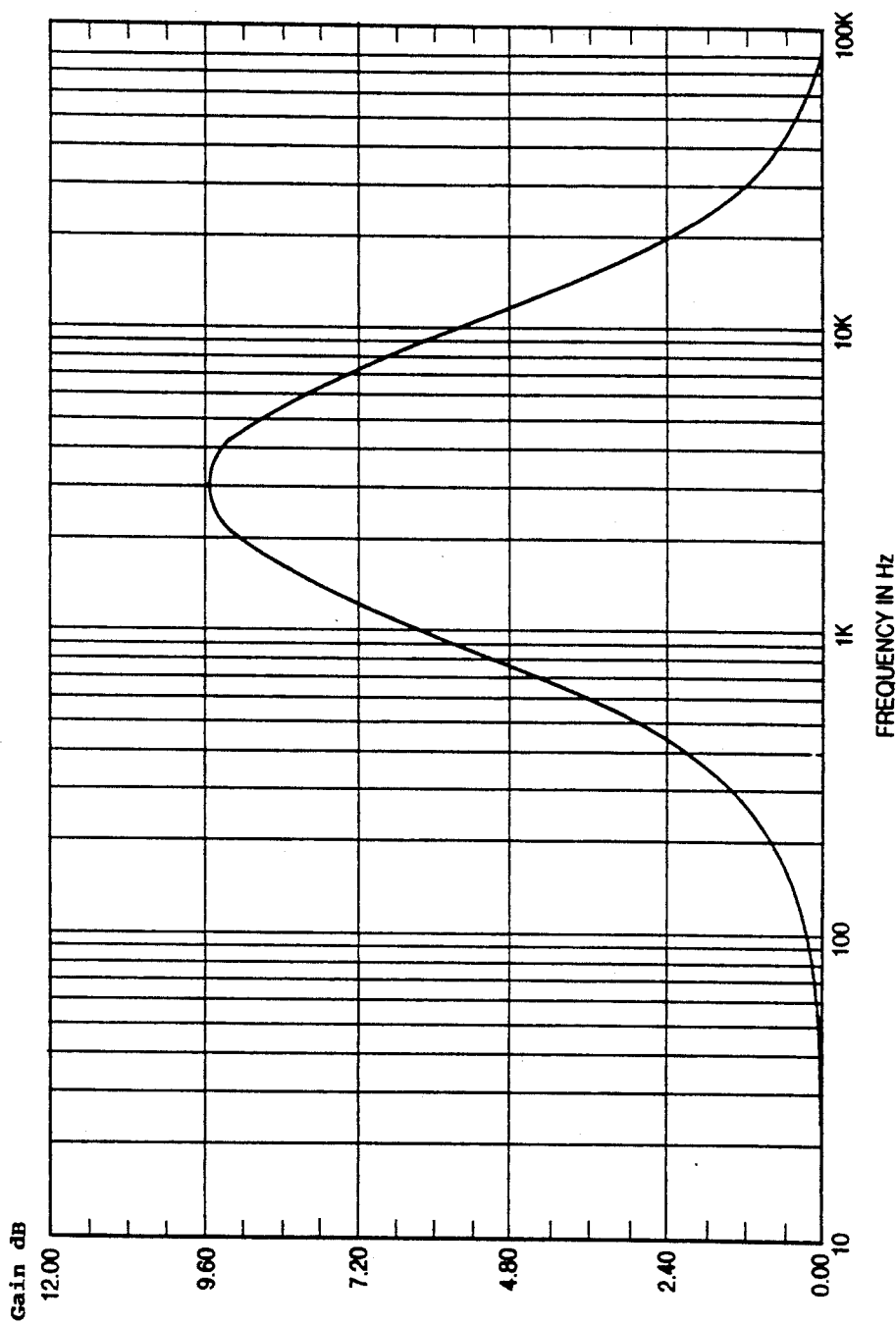
FIG. 7 shows the bandpass frequency characteristics of the midtreble filter.

FIG. 4 illustrates the frequency response characteristics of the notch filter. FIG. 5 illustrates the low pass frequency response characteristics of the bass filter at maximum boost. FIG. 6 depicts the bandpass frequency characteristics of the mid-bass filter at maximum boost. FIG. 7 illustrates the bandpass frequency characteristics of the mid-treble filter at maximum boost, while FIG. 8 shows the high pass frequency response characteristics of the treble filter at maximum boost.

As shown in FIG. 2, the processed audio signal is finally routed to output amplifier 80, then to power amplifier 95 and loudspeaker 96.

In operation, each microphone channel M1-M8 is individually equalized by programming the various notch and tone control filters to eliminate undesirable feedback frequencies and uniformly shape the frequency response of each microphone channel. Programming is accomplished by microprocessor 108 and user controls 30 and user display 40; the state of the filters can be optimally adjusted by visual reference to user display 40 and rotary adjustment of "ADJUST" 113; and thereafter stored. This normally accomplishes one-time adjustment for any given acoustic situation.

While active state-variable filters are preferred, those ordinarily skilled in the art will recognize that other filter circuits such as passive element filters with adjustable components, however cumbersome and unstable, could be used.

Although the invention has been described with reference to these preferred embodiments, other embodiments can achieve the same results. Variations and modifications of the present invention will be obvious to those skilled in the art and it is intended to cover in the appended claims all such modifications and equivalents.

What is claimed is:

1. Apparatus for equalizing a microphone channel in a sound system comprising:
   means for simultaneously providing an audio signal to a filter network and a logic input signal responsive only to an on-off state of said microphone channel to a microprocessor;
   means for selectively filtering the audio signal based solely upon the logic input signal provided to said microprocessor; and
   wherein said means for selectively filtering the audio signal further comprises a combination of preprogrammed filters preset by a user.

2. The invention of claim 1 wherein said means for simultaneously providing an audio signal to said filter network and a logic signal to said microprocessor comprises automatic audio mixer means.

3. The invention of claim 1 wherein said filter network comprises a plurality of notch filter means.

4. The invention of claim 3 wherein each of said plurality of notch filter means comprises bandpass filter means and subtraction circuit means.

5. The invention of claim 3 wherein each of said plurality of notch filter means comprise variable attenuation frequencies in the range of between approximately 50 Hz and 5 KHz.

6. The invention of claim 1 wherein said filter network further comprises a plurality of tone control filter means.

7. The invention of claim 6 wherein said plurality of tone control filter means comprises high pass filter means, low pass filter means and bandpass filter means.

8. The invention of claim 1 wherein said microprocessor further comprises a non-volatile memory.

9. The invention of claim 1 wherein said microprocessor further comprises user control means.

10. The invention of claim 9 wherein said user control means further comprises filter parameter adjustment means.

11. The invention of claim 1 wherein said microprocessor further comprises user display means.

12. The invention of claim 1 wherein said sound system further comprises link means, thereby a plurality greater than eight microphone channels are utilized.

13. The invention of claim 1 wherein said sound system further comprises output amplifier means, power amplifier means, and loudspeaker means.

14. A method of equalizing a microphone channel in a sound system comprising the steps of:
   a) providing an audio signal to a filter network while simultaneously providing a logic input signal responsive only to an on-off state of said microphone channel to a microprocessor; and
   b) selectively filtering the audio signal based solely upon the logic input signal provided to the microprocessor; and
   wherein the step of selectively filtering the audio signal further comprises the step of providing a combination of preprogrammed filters preset by a user.

15. The invention of claim 14 wherein the step of providing a logic signal to a microprocessor further comprises the step of providing a logic input device.

16. The invention of claim 14 wherein the step of selectively filtering the audio signal further comprises the steps of:
   a) selecting the operational mode of the microprocessor;
   b) selecting the appropriate filter function parameters; and
   c) adjusting the selected filter function parameters.

17. The invention of claim 16 wherein the step of adjusting the selected filter function parameters further comprises the step of programming a plurality of filters in the filter network.

18. The invention of claim 17 wherein the step of programming a plurality of filters further comprises programming a plurality of notch filters in the filter network.

19. The invention of claim 17 wherein the step of programming a filter comprises programming a plurality of tone control filters in the filter network.

20. Apparatus for equalizing multiple microphones in a sound system comprising:
   means for connecting a plurality of microphones to automatic audio mixer means;
   means for providing audio signals from said automatic audio mixer means;
   means for providing logic signals from said automatic audio mixer means;
   means for amplifying and coupling said audio signals to a filter network;
   means for coupling logic input signals, said logic input signals responsive only to an on-off state of each of said plurality of microphones to a microprocessor;
   means for selectively filtering said audio signals based solely upon said logic input signals; and
   means for amplifying and coupling said filtered audio signals to loudspeaker means;
   wherein said means for selectively filtering said audio signals further comprises a combination of preprogrammed filters preset by a user.

21. The invention of claim 20 wherein said means for providing logic signals includes means for providing a logic signal for each active microphone.

22. The invention of claim 21 wherein said means for providing a logic signal for each active microphone comprises logic input means.

23. The invention of claim 20 wherein said means for selectively filtering said audio signals further comprises:
   means for selecting an operational mode of said microprocessor;
   means for selecting appropriate filter function parameters; and
   means for adjusting said selected filter function parameters.

24. The invention of claim 20 wherein said filter network means comprises three notch filters.

25. The invention of claim 24 wherein center frequencies of said notch filters are programmable.

26. The invention of claim 20 wherein said filter network means further comprises four tone control filters.

27. The invention of claim 25 wherein said tone control filters are programmable.

28. A method of equalizing multiple microphone channels in a sound system comprising the steps of:
   a) connecting a plurality of microphones to an automatic audio mixer;
   b) providing audio signals from the automatic audio mixer;
   c) providing logic signals from the automatic audio mixer;
   d) simplifying and coupling the audio signals to a filter network;
   e) providing a logic input signal responsive only to an on-off state of each of the plurality of microphones selectively filtering the audio signals based solely upon the logic input signals coupled to the microprocessor; and
   f) amplifying and coupling the filtered audio signals to loudspeakers;
   wherein the step of selectively filtering the audio signals further comprises the step of providing a combination of preprogrammed filters preset by a user.

29. The method of claim 28 wherein the step of selectively filtering the audio signals further comprises the steps of:
   a) selecting an operational mode of the microprocessor;
   b) selecting appropriate filter function parameters; and
   c) adjusting the selected filter function parameters.

* * * * *